(12) United States Patent
Johansen et al.

(10) Patent No.: US 9,980,052 B2
(45) Date of Patent: May 22, 2018

(54) MEMS-MICROPHONE WITH REDUCED PARASITIC CAPACITANCE

(75) Inventors: Leif Steen Johansen, Broenshoej (DK); Jan Tue Ravnkilde, Hedehusene (DK); Pirmin Hermann Otto Rombach, Kongens Lyngby (DE); Kurt Rasmussen, Herlev (DK)

(73) Assignee: TDK CORPORATION, Tokyo (JP)

( * ) Notice: Subject to any disclaimer, the term of this patent is extended or adjusted under 35 U.S.C. 154(b) by 83 days.

(21) Appl. No.: 13/261,881

(22) PCT Filed: Nov. 14, 2011

(86) PCT No.: PCT/EP2011/070071
§ 371 (c)(1),
(2), (4) Date: Aug. 13, 2014

(87) PCT Pub. No.: WO2013/071952
PCT Pub. Date: May 23, 2013

(65) Prior Publication Data
US 2015/0076627 A1    Mar. 19, 2015

(51) Int. Cl.
*H04R 19/04* (2006.01)
*H04R 31/00* (2006.01)
*H04R 19/00* (2006.01)
*B81B 7/00* (2006.01)

(52) U.S. Cl.
CPC ........... *H04R 19/04* (2013.01); *B81B 7/0025* (2013.01); *H04R 19/005* (2013.01); *H04R 31/003* (2013.01); *B81B 2201/0257* (2013.01); *B81C 2201/053* (2013.01); *H04R 2201/003* (2013.01); *H04R 2410/03* (2013.01)

(58) Field of Classification Search
CPC ................................ H04R 31/00; H04R 19/04
USPC ....................................... 257/416; 438/5, 53
See application file for complete search history.

(56) References Cited

U.S. PATENT DOCUMENTS

| | | | |
|---|---|---|---|
| 5,573,679 A | 11/1996 | Mitchell et al. | |
| 6,847,090 B2 | 1/2005 | Loeppert | |
| 6,975,010 B2 * | 12/2005 | Lee et al. | ........................ 257/419 |
| 7,190,038 B2 * | 3/2007 | Dehe et al. | ........... B81B 3/0021 257/324 |
| 7,466,834 B2 | 12/2008 | Ogura et al. | |
| 8,664,733 B2 | 3/2014 | Rombach | |
| 8,803,257 B2 | 8/2014 | Kasai et al. | |
| 2007/0165888 A1 | 7/2007 | Weigold | |

(Continued)

FOREIGN PATENT DOCUMENTS

| | | |
|---|---|---|
| DE | 102010008044 A1 | 8/2011 |
| EP | 1722596 A1 | 11/2006 |

(Continued)

OTHER PUBLICATIONS

Rombach, P., et al., "The first low voltage, low noise differential silicon microphone, technology development and measurement results," Sensors and Actuators A, vol. 95, Issues 2-3, Jan. 2002, pp. 196-201.

(Continued)

*Primary Examiner* — Sheng Zhu
(74) *Attorney, Agent, or Firm* — Slater Matsil, LLP

(57) ABSTRACT

A MEMS microphone with reduced parasitic capacitance is provided. A microphone includes a protection film covering a rim-sided area of the backplate.

9 Claims, 2 Drawing Sheets

(56) References Cited

U.S. PATENT DOCUMENTS

| | | | |
|---|---|---|---|
| 2007/0189558 A1* | 8/2007 | Ogura et al. | 381/191 |
| 2008/0050845 A1* | 2/2008 | Ulm et al. | 438/5 |
| 2009/0016550 A1* | 1/2009 | Qiao | 381/175 |
| 2009/0080682 A1 | 3/2009 | Ogura et al. | |
| 2009/0218642 A1* | 9/2009 | Miller et al. | 257/416 |
| 2009/0273043 A1* | 11/2009 | Lee et al. | B81C 1/00182 257/416 |
| 2010/0117124 A1 | 5/2010 | Nakatani | |
| 2011/0075865 A1* | 3/2011 | Yang et al. | H04R 19/005 381/174 |
| 2011/0075866 A1* | 3/2011 | Zhang | 381/174 |
| 2012/0014642 A1* | 1/2012 | Hanneman, Jr. et al. | 385/16 |
| 2012/0199921 A1* | 8/2012 | Tanaka et al. | 257/415 |
| 2012/0213400 A1* | 8/2012 | Kasai | 381/369 |

FOREIGN PATENT DOCUMENTS

| | | |
|---|---|---|
| EP | 2328361 A1 | 6/2011 |
| JP | 2004128957 | 4/2004 |
| JP | 4264104 B2 | 5/2009 |
| JP | 2009218688 A | 9/2009 |
| JP | 201056745 A | 3/2010 |
| JP | 2010103701 A | 5/2010 |
| JP | 2011055087 A | 3/2011 |
| WO | 2011101291 A1 | 8/2011 |

OTHER PUBLICATIONS

Brewer Science ProTEK PSB: "Photosensitive Alkaline-Protective Coating," Brewer Science, http://www. brewerscience.com/uploads/products/protek/datasheets/protek_psb.ds.pdf, 2 pages, Nov. 19, 2009.

\* cited by examiner

MEMS-MICROPHONE WITH REDUCED PARASITIC CAPACITANCE

This patent application is a national phase filing under section 371 of PCT/EP2011/070071, filed Nov. 14, 2011, which is incorporated herein by reference in its entirety.

TECHNICAL FIELD

The present invention relates to MEMS microphones with reduced parasitic capacitance and methods for manufacturing such microphones.

BACKGROUND

MEMS microphones usually comprise a conductive backplate and a conductive, flexible membrane arranged at a distance from the backplate. The backplate and the membrane realize electrodes of a capacitor. When a bias voltage is applied to the electrodes, oscillations of the membrane caused by received acoustic signals are converted into electrical signals. For further signal processing MEMS-microphones can comprise an ASIC (Application-specific Integrated Circuit) chip.

The microphone has a central region and a rim region. The central region is defined as the acoustically active region of the microphone. This central region is surrounded by the rim region that is acoustically inactive. Within the rim region, connection means for mechanically and/or electrically connecting the backplate and the membrane are arranged on a substrate material. For constructing MEMS microphones, manufacturing processes of semiconductor devices such as layer deposition, deposition of photo resist films, structuring photoresist films, and partly removing structured layers are utilized. The capacitor has an acoustically active section being defined by the acoustically active region of the microphone. Further, the capacitor has an acoustically inactive section being defined by the capacitor's section within the rim region.

SUMMARY OF THE INVENTION

A MEMS microphone comprises a system of stacked layers. However, the capacitor's acoustically inactive section deteriorates the performance of the microphone due to parasitic capacitance. The corresponding signal attenuation is:

$$H_c = C_m/(C_m + C_i + C_p) \quad (1)$$

where $C_i$ is the input capacitance of an according ASIC chip processing the electrical signal, and $C_p$ is the parasitic capacitance, i.e., the capacitance of the capacitor's acoustically inactive section. $C_m$ is the total capacitance comprising the capacitance of the rim region and the capacitance of the central region. It can be seen that reducing the parasitic capacitance reduces the signal's deterioration and, thus, improves the microphone's signal quality.

$C_p$ mainly depends on the acoustically inactive overlapping region of the backplate and the membrane.

Embodiments of the present invention provide a MEMS microphone with reduced parasitic capacitance and a method for manufacturing such a microphone.

A MEMS microphone comprises a membrane in a membrane layer, a first backplate in a first backplate layer, an anchor element in an anchor layer between the membrane layer and the first backplate layer, and a protection film. The microphone further comprises an active region and a rim region. The rim region surrounds the active region. The protection film covers the first backplate and/or the anchor element in the rim region.

Thus, the MEMS microphone comprises a stack of layers in which the respective functional elements, the membrane, the backplate and the anchor element are established. The active region is defined as the acoustically active region. The rim region is used for mechanically and/or electrically connecting the backplate and the membrane to the microphone's body and/or to external electric circuits such as an ASIC chip.

The backplate's inactive section has a certain width W overlapping with the membrane. The protection film covers at least a sensitive area of the backplate's inactive section. As a result, the backplate's inactive section and the anchor element between the backplate and the membrane are protected against environmental influence. The anchor element acts as a connection element for mechanically connecting the backplate and the membrane. Further, the anchor element spatially separates the backplate from the membrane preventing an electric short circuit.

During manufacturing steps of such a MEMS microphone, the material of the anchor layer of the central section has to be removed in order to separate the membrane from the backplate. However, within the rim section material of the anchor layer has to remain between the backplate and the membrane to establish the anchor element. Usually, the element of the backplate within the rim section protects the anchor element during this step. The mechanical stability of the anchor element demands for a certain width of the backplate's rim section. A wider backplate's rim section results in a bigger parasitic capacitance $C_p$. A larger parasitic capacitance $C_p$ results in a deterioration of the signal quality.

It was found that the protection film enables a microphone with a backplate having a smaller area in the rim section without jeopardizing the anchor element's mechanical stability. Thus, a MEMS microphone providing good mechanical stability and good electrical signal quality is obtained.

In one embodiment, the protection film comprises a material that resists a VHF environment (Vapor Phase HF etching environment, utilizing hydrofluoric acid). A VHF environment can be utilized to remove the material of the anchor layer within the acoustically active region. The protection film can resist such an etching environment and, thus, the anchor element that has to remain after the etching process is protected.

In one embodiment, the protection film is photo-sensitive. Thus, the protection film can be structured by photolithography processes.

The protection film can comprise a polymer material.

In one embodiment, the protection film is a proTEK® PSB film.

Such a film is a photo-sensitive polymer film that can resist a VHF environment.

In one embodiment, the anchor element flushes with the first backplate. Thus, the rim surface of the anchor element and the rim surface of the first backplate are directly arranged one above the other. Accordingly, the protection film can easily cover both elements simultaneously in a simple but effective topology.

Further, the area of the inactive section of the backplate within the microphone's rim region and the corresponding parasitic capacitance $C_p$ is decreased without reducing the microphone's stability.

In one embodiment, the anchor element comprises a silicon oxide, e. g., silicon dioxide $SiO_2$. $SiO_2$ is an insulating material. Thus, the backplate and the membrane are electrically isolated. Further, $SiO_2$ provides good adhesion properties to establish a mechanically stable connection between the backplate and the membrane. Further, $SiO_2$ is easily removable within the microphone's acoustically active region by means of VHF techniques.

In one embodiment, the MEMS microphone further comprises an additional backplate in an additional backplate layer. The membrane layer is arranged between the first backplate layer and the additional backplate layer. Thus, a double backplate microphone providing a still improved signal quality is obtained. The membrane may be electrically and mechanically separated by a further isolating layer from the additional backplate.

In one embodiment, a MEMS microphone further comprises a ring-shaped isolation element in the additional backplate layer. The ring-shaped isolation element comprises an isolating material and surrounds the additional backplate. The isolating material can comprise a silicon oxide, e. g., $SiO_2$.

It was found that the section of the additional backplate within the rim region and the rim region's section of the membrane further establish a parasitic capacitance deteriorating the microphone's signal quality. As a ring-shaped isolation element electrically separates a major section of the additional backplate in the rim region from the acoustically active region's section of the additional backplate unwanted parasitic capacitances are further reduced.

A method for manufacturing a MEMS microphone comprises the steps:
  forming a membrane in a membrane layer,
  depositing an anchor layer on the membrane layer,
  depositing a first backplate layer on the anchor layer,
  structuring the first backplate in the first backplate layer,
  depositing a protection film in a rim region onto the first backplate and/or the anchor layer,
  removing the material of the anchor layer in a central region.

As a protection film is deposited onto the first backplate and/or the anchor element, an etching agent cannot damage the material of the anchor element from a rim located position that establishes the later anchor element.

In one embodiment, a VHF method is used to remove the material of the anchor layer in the central region. Examples of MEMS microphones are shown in the figures.

DETAILED DESCRIPTION OF ILLUSTRATIVE EMBODIMENTS

Figure 1:
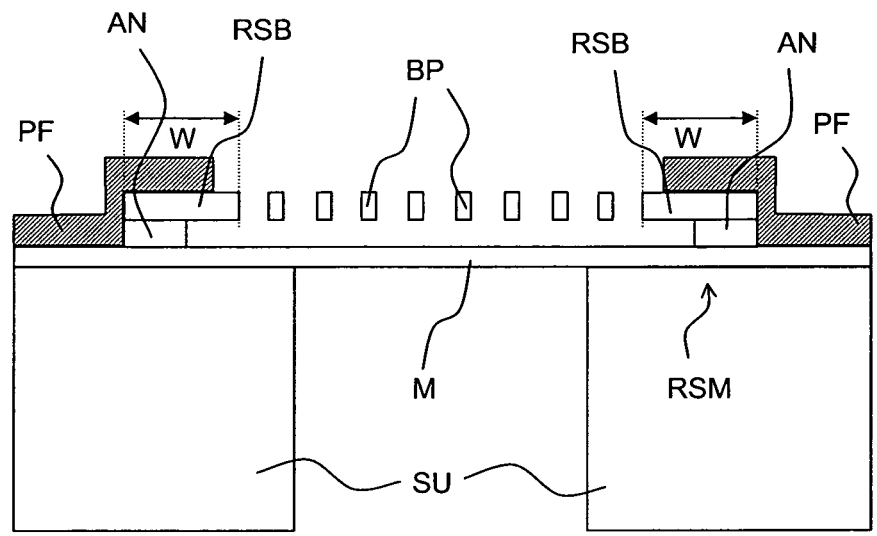
FIG. 1 shows a cross-section of a MEMS microphone comprising a protection film covering a part of backplate's inactive section.

FIG. 1 shows a cross-section of a MEMS microphone comprising a backplate BP and a membrane M. The microphone has an acoustically active region AAR and a rim region RR surrounding the acoustically active region AAR. Within the rim region RR, the backplate BP and the membrane M are mechanically connected to the microphone's body. An anchor element AN electrically isolates the backplate BP from the membrane M and mechanically connects the backplate BP to the membrane M. An acoustically inactive section of the backplate BP within the rim region RR has a width W and overlaps with the corresponding section of the membrane M. Thus, the total capacitance of the microphone comprises a parasitic capacitance depending on width W. As a protection film PF protects the anchor element AN against aggressive environments, especially acting from a rim located position during manufacturing steps, the width W can be minimized without jeopardizing the anchor element and, thus, without jeopardizing the microphone's stability. The backplate BP flushes with the anchor element AN.

It is possible that an oxide layer is arranged between the substrate SU and the membrane M. If the substrate SU comprises silicon the oxide layer can be a silicon oxide layer.

Figure 2:
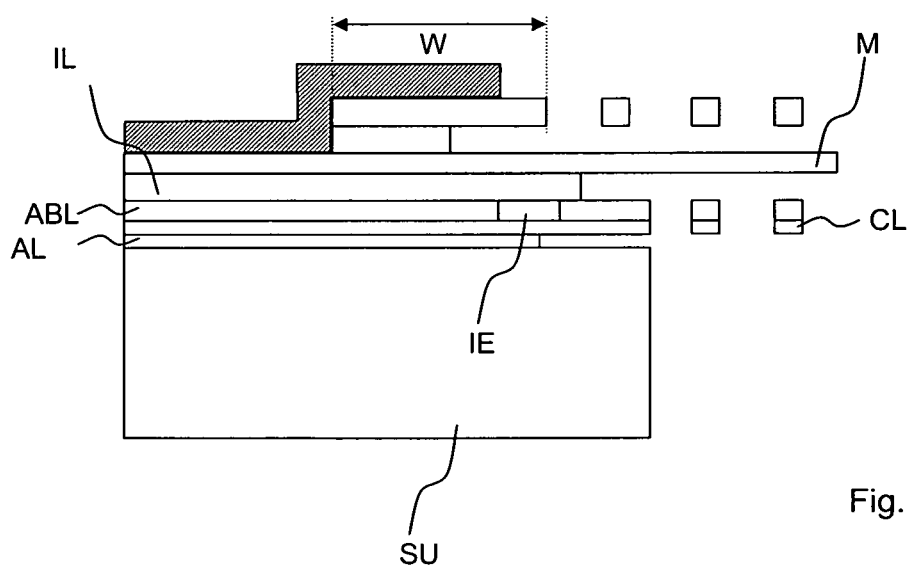
FIG. 2 shows a cross-section of a double backplate microphone.

FIG. 2 shows a cross-section of a double backplate microphone comprising further layers. Directly on a substrate SU, an adhesion layer AL that may comprise silicon dioxide $SiO_2$ is arranged. The double backplate microphone has an additional backplate comprising a compensation layer CL and an additional backplate layer ABL. The compensation layer CL may comprise stoichiometric nitride $Si_3O_4$ or non-stoichiometric nitride $Si_xO_y$. Non-stoichiometric nitride such as silicon rich nitride can be a low stress nitride that may have a tensile stress that is lower than the tensile stress of a stoichiometric nitride layer. The additional backplate layer ABL can comprise silicon such as polycrystalline silicon. The additional backplate comprising silicon and a nitride may have a tensile stress.

Of course, the first backplate can comprise a material with a Young's modulus having compressive stress components, too.

An isolation element IE which may be ring-shaped is arranged in the additional backplate layer electrically isolating the acoustically active section from the acoustically inactive section of the additional backplate. Thus, parasitic capacitance is further reduced.

Further, an isolation layer IL is arranged between the membrane M and the additional backplate layer ABL.

Figure 3:
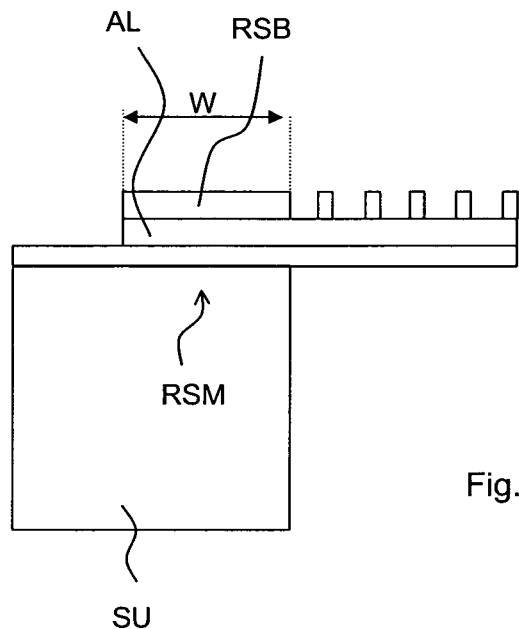
FIG. 3 shows a cross-section of a MEMS microphone in a pre-etching state.

FIG. 3 shows a cross-section of a MEMS microphone before the material of the anchor layer is removed in the acoustically active region.

Figure 4:
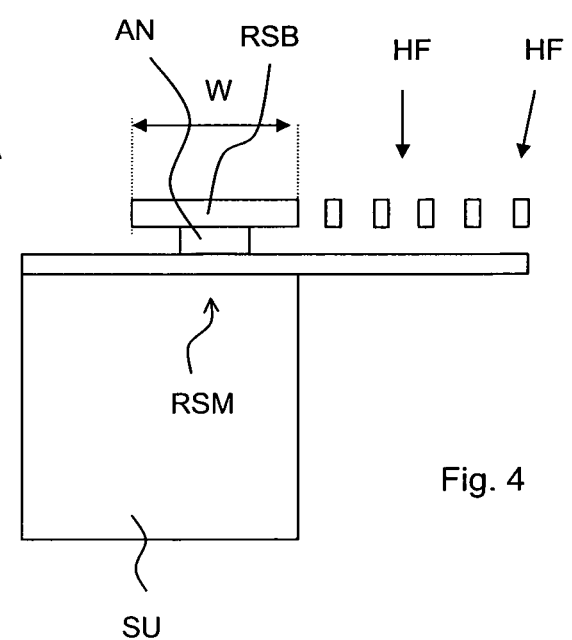
FIG. 4 shows a cross-section of the microphone of FIG. 3 after an etching step.

FIG. 4 shows a cross-section of the MEMS microphone of FIG. 3 after the corresponding etching process during which chemical agents such as Hf may be applied to the microphone in order to remove material of the anchor layer in the acoustically active region.

The—chemically mostly inert—section rim-sided backplate RSB acts as a shield to protect the anchor element AN from etching. However, the etching agent can attack the anchor element AN from a rim sided position. In order to obtain a sufficiently wide anchor element AN, the rim-sided area of the backplate RSB has to have a greater width W than the anchor element. The backplate RSB may not flush with the anchor element AN. Thus, a less-perfect ratio between the parasitic capacitance $C_p$ and the microphone's stability is obtained.

For example, the width of the rim-sided backplate RSB can be reduced from 23 µm to 16 µm when the anchor is protected by a protection film.

A MEMS microphone is not limited to the embodiments described in the specification or shown in the figures. Microphones comprising further elements or layers or further active or inactive regions or protection films or combinations thereof are also comprised by the present invention.

The invention claimed is:

1. A MEMS microphone comprising:
    a membrane in a membrane layer;
    a first backplate in a first backplate layer;
    an anchor element in an anchor layer between the membrane layer and the first backplate layer, wherein the anchor element mechanically connects the first backplate to the membrane, and wherein the anchor element comprises $SiO_2$;
    a protection film;
    an active region;
    a rim region surrounding the active region;
    an additional backplate in an additional backplate layer, wherein the membrane layer is arranged between the first backplate layer and the additional backplate layer; and
    a ring-shaped isolation element located in the additional backplate layer, wherein the ring-shaped isolation element comprises silicon dioxide and surrounds a central section of the additional backplate,
    wherein the protection film covers an outer side surface and a top surface of the first backplate and an outer side surface of the anchor element in the rim region, and wherein the protection film further covers a top surface of the membrane outside of the outer side surface of the anchor element, and wherein an inner side surface of the protection film is aligned directly over the top surface of a rim-sided area of the first backplate and is disposed between the outer side surface of the first backplate and an inner side surface of the rim-sided area of the first backplate,
    wherein the protection film covers the outer side surface of the anchor element but not an inner side surface of the anchor element,
    wherein the protection film is in direct contact with at least a portion of the outer side surface of the anchor element,
    wherein the protection film protects the anchor element, and
    wherein the protection film comprises a material that resists a VHF environment.

2. The MEMS microphone of claim 1, wherein the protection film is photo sensitive.

3. The MEMS microphone of claim 1, wherein the protection film is a proTEK® PSB film.

4. The MEMS microphone of claim 1, wherein the anchor element is flush with the first backplate.

5. The MEMS microphone of claim 1, wherein the protection film at least partially covers top surfaces of the first backplate and the anchor element in the rim region.

6. A method for manufacturing a MEMS microphone, the method comprising:
    forming a membrane in a membrane layer;
    forming an anchor element in an anchor layer deposited over the membrane layer, wherein the anchor element comprises $SiO_2$;
    depositing a first backplate layer over the anchor layer;
    structuring the first backplate in the first backplate layer to form a first backplate;
    depositing a protection film in a rim region directly onto a side surface of the anchor layer;
    removing a material of the anchor layer in a central region while the protection film protects an anchor element;
    forming an additional backplate in an additional backplate layer, wherein the membrane layer is arranged between the first backplate layer and the additional backplate layer; and
    forming a ring-shaped isolation element in the additional backplate layer, wherein the ring-shaped isolation element comprises silicon dioxide and surrounds a central section of the additional backplate that is aligned directly under an acoustically active region, wherein the ring-shaped isolation element has an uppermost surface disposed at, or below, a level of an uppermost surface of the additional backplate layer, and extends contiguously to a lowermost surface of the ring-shaped isolation element disposed at, or above, a level of a lowermost surface of the additional backplate layer, and wherein the ring-shaped isolation element extends contiguously from an outermost surface of ring-shaped isolation element to an innermost surface of the ring-shaped isolation element that faces the acoustically active region,
    wherein the protection film covers an outer side surface of the anchor element but not an inner side surface of the anchor element,
    wherein the anchor element mechanically connects the first backplate to the membrane, and
    wherein the protection film comprises a material that resists a VHF environment.

7. The method of claim 6, wherein removing the material of the anchor layer in the central region comprises using a VHF method.

8. The method of claim 7, wherein the protection film comprises a material that resists a VHF environment.

9. The method of claim 7, wherein the protection film covers at least partially covers top surfaces of the first backplate and the anchor element in the rim region.

* * * * *

UNITED STATES PATENT AND TRADEMARK OFFICE
CERTIFICATE OF CORRECTION

PATENT NO. : 9,980,052 B2  
APPLICATION NO. : 13/261881  
DATED : May 22, 2018  
INVENTOR(S) : Leif Steen Johansen et al.

Page 1 of 1

It is certified that error appears in the above-identified patent and that said Letters Patent is hereby corrected as shown below:

On the Title Page

Item (75) Inventors, Line 1, delete "Broenshoej (DK)" and insert --Kgs. Lyngby (DK)--.

Item (75) Inventors, Line 4, delete "Kongens Lyngby (DE)" and insert --Kongens Lyngby (DK)--.

In the Claims

In Column 6, Line 49, Claim 9, delete "covers at least partially covers top surfaces" and insert --at least partially covers top surfaces--.

Signed and Sealed this  
Ninth Day of October, 2018

Andrei Iancu  
*Director of the United States Patent and Trademark Office*